United States Patent
Sio et al.

(10) Patent No.: US 10,510,599 B2
(45) Date of Patent: Dec. 17, 2019

(54) FINFET SWITCH

(71) Applicant: Taiwan Semiconductor Manufacturing Company Limited, Hsinchu (TW)

(72) Inventors: Kam-Tou Sio, Hsinchu County (TW); Chih-Liang Chen, Hsinchu (TW); Charles Chew-Yuen Young, Cupertino, CA (US); Ho Che Yu, Hsinchu County (TW)

(73) Assignee: Taiwan Semiconductor Manufacturing Company Limited, Hsinchu (CN)

(*) Notice: Subject to any disclaimer, the term of this patent is extended or adjusted under 35 U.S.C. 154(b) by 345 days.

(21) Appl. No.: 15/413,729

(22) Filed: Jan. 24, 2017

(65) Prior Publication Data

US 2017/0301586 A1 Oct. 19, 2017

Related U.S. Application Data

(60) Provisional application No. 62/321,793, filed on Apr. 13, 2016.

(51) Int. Cl.
*H01L 21/768* (2006.01)
*H01L 23/535* (2006.01)
*H01L 29/78* (2006.01)

(52) U.S. Cl.
CPC .. *H01L 21/76897* (2013.01); *H01L 21/76805* (2013.01); *H01L 21/76834* (2013.01); *H01L 23/535* (2013.01); *H01L 29/7851* (2013.01)

(58) Field of Classification Search
CPC ....... H01L 29/41791; H01L 2029/7858; H01L 29/4238; H01L 27/0886; H01L 21/76805; H01L 27/1211; H01L 23/52–23/535
See application file for complete search history.

(56) References Cited

U.S. PATENT DOCUMENTS

| | | | | |
|---|---|---|---|---|
| 9,337,099 B1* | 5/2016 | Jain | | H01L 21/823418 |
| 9,397,095 B1* | 7/2016 | Cheng | | H01L 27/0886 |
| 9,698,230 B2* | 7/2017 | Cheng | | H01L 21/76897 |
| 9,818,651 B2* | 11/2017 | Bouche | | H01L 21/823871 |
| 2016/0293485 A1* | 10/2016 | Song | | H01L 21/32139 |
| 2019/0006373 A1* | 1/2019 | Huang | | G06F 17/5072 |

* cited by examiner

*Primary Examiner* — William F Kraig
*Assistant Examiner* — Khatib A Rahman
(74) *Attorney, Agent, or Firm* — Jones Day

(57) ABSTRACT

An embodiment of a semiconductor switch structure includes source contacts, drain contacts, gates and fins. The contacts and gates are elongated in a first direction and are spaced apart from each other in a second direction perpendicular to the first direction. The gates are interspersed between the contacts. The fins underlie both the contacts and the gates. The fins are elongated in the second direction and are spaced apart from each other in the first direction. A contact via extends through one of the contacts without contacting a gate or a fin. A gate via extends through one of the gates without contacting a contact or a fin. A contact-gate via is in contact with both a contact and a gate but not a fin.

19 Claims, 7 Drawing Sheets

FINFET SWITCH

CROSS-REFERENCE TO RELATED APPLICATION

This application claims priority to U.S. Provisional Application No. 62/321,793, filed Apr. 13, 2016, which is incorporated herein by reference.

TECHNICAL FIELD

This relates to a finFET in a semiconductor device.

BACKGROUND

Power gating is a technique for low power applications. By power gating, a high speed chip can keep running in high frequency, while blocks not in use are powered-off to save power. This can be achieved using a semiconductor FET (field effect transistor) switch, which requires extremely small turn-on resistance (Ron) and high ratio of current on to current off. Chip IR drop is preferably as small as possible. When device dimension shrinks, front-end-of-line (FEOL) resistance rises due to diffusion, and contact area decreases. Also, back-end-of-line (BEOL) resistance rises due to shrinking metal conductor width and via size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
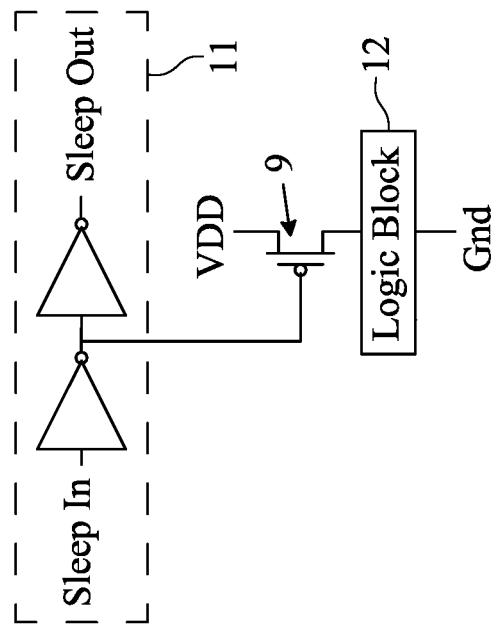
FIGS. 1 and 2 show two example circuits that include an example finFET switch, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances in this description, a term is followed by an alternative term or a substantially equivalent term enclosed in parentheses.

Figure 2:
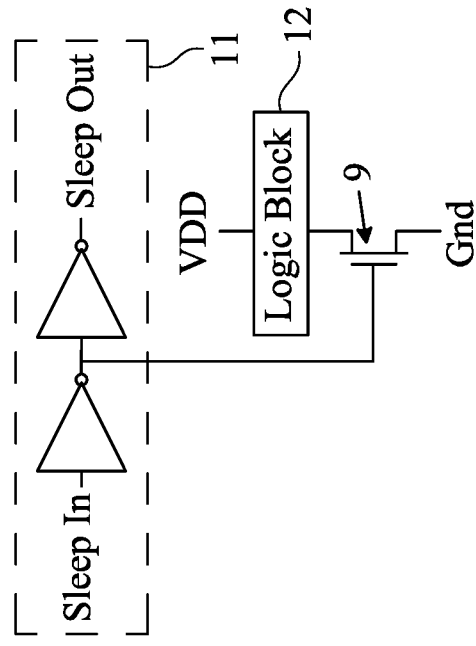

FIGS. 1 and 2 show example circuits that include a switch 9 that is controlled by a controller (control circuit) 11. In this example, the switch 9 is a semiconductor field effect transistor (FET). The FET 9 functions as a switch for selectively conducting power from a supply VDD to a logic block 12. In FIG. 1, the switch 9 is in a header region of the circuit, to supply current from a supply voltage VDD to the logic block 12. In FIG. 2, the logic block 12 draws current directly from VDD, and the switch 9 is in a footer region of the circuit, to draw current from the logic block 12 to ground (Gnd).

Figure 3:
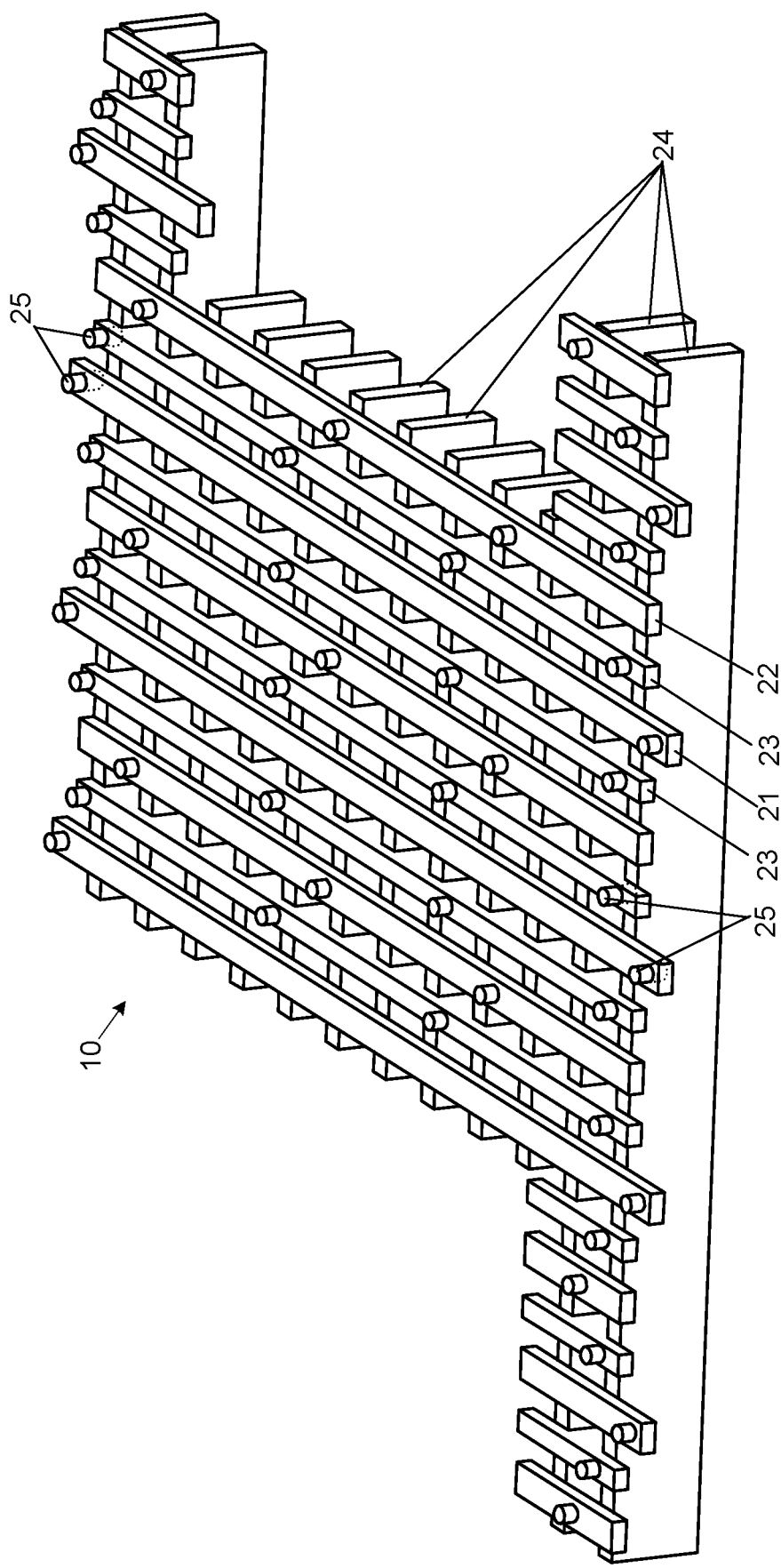
FIG. 3 is a perspective view of an example structure of the switch, in accordance with some embodiments.
Figure 4:
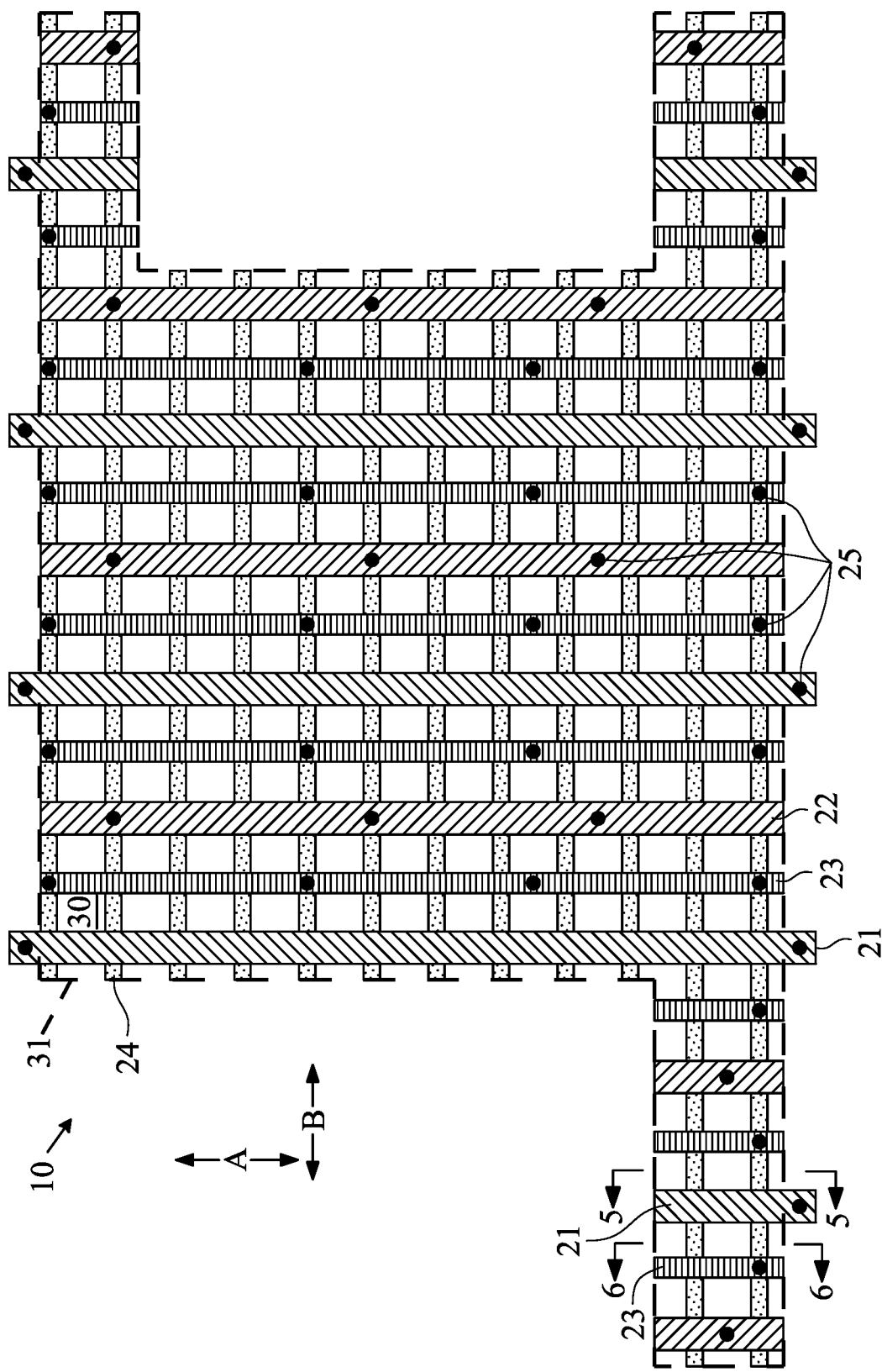
FIG. 4 is a top view of the switch structure, in accordance with some embodiments.

FIGS. 3 and 4 are respectively a perspective view and a top view of a structure 10 (switch structure) of the example switch 9. The switch structure 10 includes source contacts 21, drain contacts 22, and gates 23. The contacts 21, 22 and gates 23 are elongated in a longitudinal direction (arrow A in FIG. 4) and are spaced apart from each other in a lateral direction (arrow B in FIG. 4) perpendicular to the longitudinal direction. The longitudinal and lateral directions A and B may be respectively called first and second directions. A gate 23 is located between a source contact 21 and a drain contact 22. And a contact 21, 22 is located between two gates 23. The switch structure 10 includes a laterally-extending repeating sequence of gate, source, gate, drain. The gates 23 are interspersed (interleaved) between the contacts 21, 22.

Figure 5:
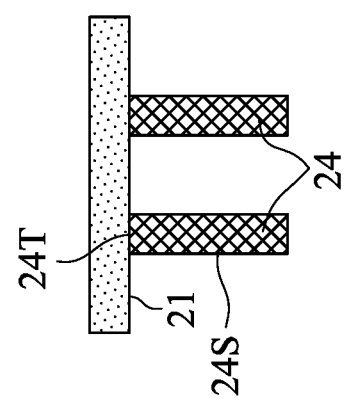
FIG. 5 is a sectional view taken at line 5-5 of FIG. 4, in accordance with some embodiments.
Figure 6:
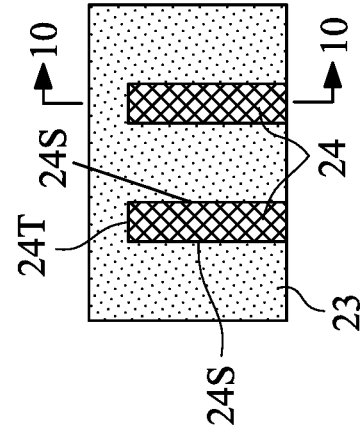
FIG. 6 is a sectional view taken at line 6-6 of FIG. 4, in accordance with some embodiments.

The contacts 21, 22 and the gates 23 are electrically and physically connected to a series of fins 24 that underlie the contacts 21, 22 and the gates 23. The fins 24 are elongated in the lateral direction and are spaced apart from each other in the longitudinal direction. Contacts 21, 22 and gates 23 are in direct contact with fins 24 that are beneath them, without an intermediate layer in-between. FIGS. 5 and 6 are cross-sectional views of a fin 24, in which a width of the fin 24 extends horizontally in the respective figure. As shown in FIG. 5, a contact 21 in this example is in direct contact with the entire width (or substantially entire width, such as over 95% of the width) of the top surface 24T of the fin 24 and not the height of the opposite side surfaces 24S of the fin 24. As shown in FIG. 6, a gate 23 in this example is in direct contact with the entire width (or substantially entire width, such as over 95% of the width) of the top surface 24T of the fin 24 and the entire height (or substantially entire height, such as over 95% of the height) of each opposite side surface 24S of the fin 24.

As shown in FIGS. 3-4, the switch structure 10 further includes different vias 25. Contact vias (either source vias or drain vias) extend through a contact 21, 22 without contacting (touching) a gate 23 or fin 24. Gate vias extend through a gate 23 without contacting a contact 21, 22 or a fin 24. Contact-fin vias contact both a contact 21, 22 and a fin 24, without contacting a gate 23. Gate-fin vias contact both a gate 23 and fin 24, without contacting a contact 21, 22.

The contacts 21, 22, gates 23 and fins 24 occupy (cover) an overall coverage area 30 that has a polygonal periphery 31 shown by a dashed line in FIG. 4.

Figure 7:
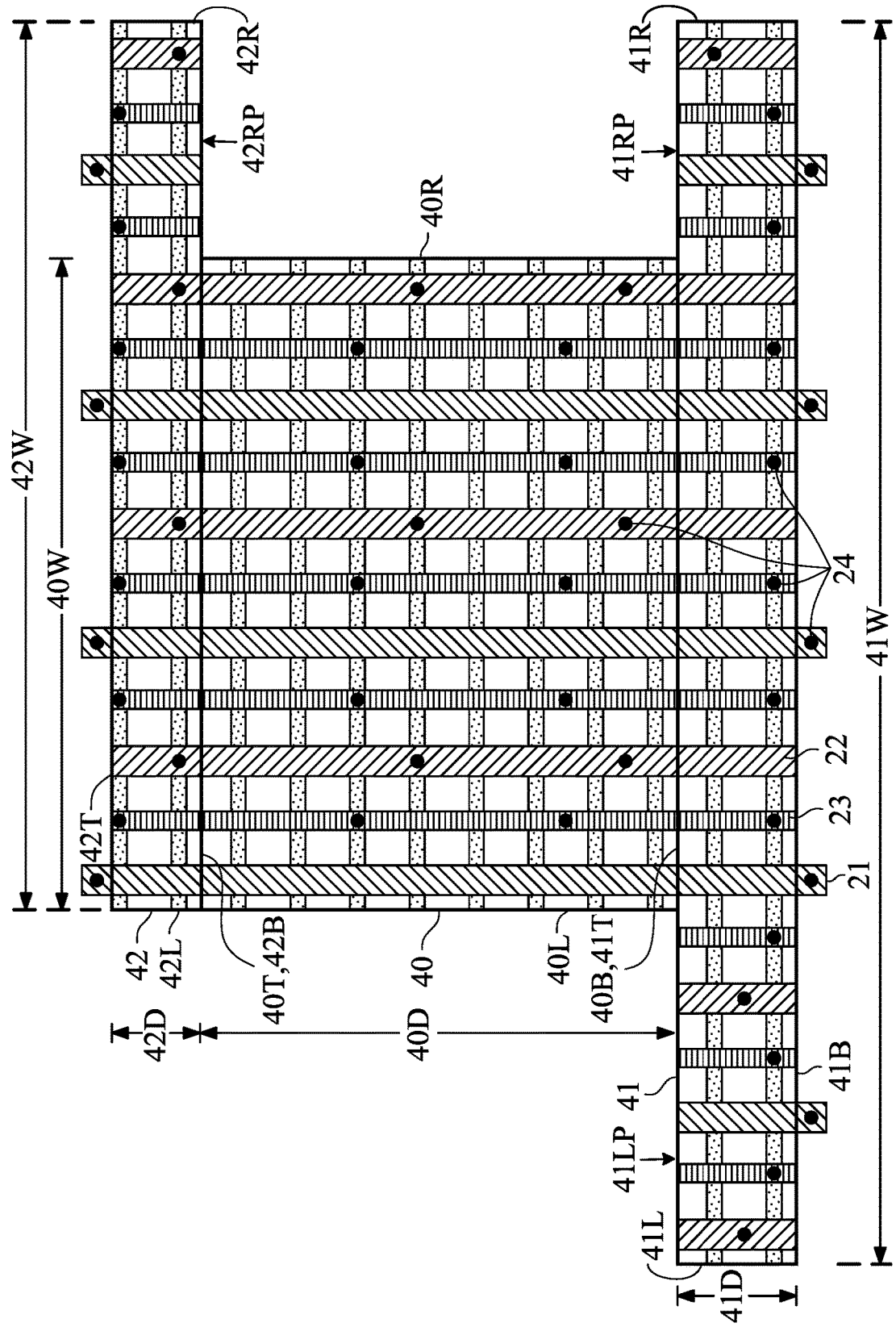
FIG. 7 is similar to FIG. 4, but showing peripheries of rectangular areas that the switch structure occupies, in accordance with some embodiments.

As shown by thick rectangular outlines in FIG. 7, the overall coverage area 30 in this example comprises a narrower rectangular area 40, a first wider rectangular area 41 and a second wider rectangular area 42.

Each rectangular area 40, 41, 42 is defined by a longitudinally-extending left periphery 40L, 41L, 42L (first side periphery) and a longitudinally-extending right periphery 40R, 41R, 42R (second side periphery) that together define a laterally-extending width 40W, 41W, 42W of the respective rectangular area 40, 41, 42. The width 41W of the first wider rectangular area 41 is greater than the width 42W of the second wider rectangular area 42 which is itself greater than the width 40W of the narrower rectangular area 40. Each rectangular area 40, 41, 42 is further defined by a laterally-extending top periphery 40T, 41T, 42T and a laterally-extending bottom periphery 40B, 41B, 42B that together define a longitudinally-extending length 40D, 41D, 42D of the respective rectangular area 40, 41, 42.

The narrower rectangular area 40 and the first wider rectangular area 41 are adjoined by the bottom periphery 40B of the narrower rectangular area 40 coinciding with the top periphery 41T of the first wider rectangular area 41. The narrower rectangular area 40 and the second wider rectangular area 42 are adjoined by the top periphery 40T of the narrower rectangular area 40 coinciding with the bottom periphery 42B of the second wider rectangular area 42.

The first wider rectangular area's left periphery 41L is left of the narrower rectangular area's left periphery 40L. A left projection 41LP of the first wider rectangular area 41 extends leftward beyond the narrower rectangular area's left periphery 40L. The first wider rectangular area's right periphery 41L is right of the narrower rectangular area's right periphery 40R. A right projection 41RP of the first wider rectangular area 41 extends rightward beyond the narrower rectangular area's right periphery 40R.

The second wider rectangular area's left periphery 42L is collinear with the narrower rectangular area's left periphery 40L. The second wider rectangular area's right periphery 42R is right of the narrower rectangular area's right periphery 40R. A right projection 42RP of the second wider rectangular area 42 extends rightward beyond the narrower rectangular area's right periphery 40R.

The narrower rectangular area 40 and the first wider rectangular area 41 together comprise a T-shaped first coverage area that the switch structure occupies. The narrower rectangular area 40 and the second wider rectangular area 42 together comprise an L-shaped second coverage area that the switch structure occupies.

Some of the contacts 21, 22 and some of the gates 23 extend unbroken entirely (substantially entirely) through the narrower rectangular area 40 and the first and second wider rectangular areas 41, 42. Those contacts 21, 22 and gates 23 thus also extend unbroken entirely (substantially entirely) through both the first and second coverage areas. Others of the contacts 21, 22 and others of the gates 23, that are in the projections 41LP, 41RP, 42RP of the wider rectangular areas 41, 42, do not extend into the narrower rectangular area 40.

Some of the fins 24 extend unbroken entirely (substantially entirely) through the narrower rectangular area 40. Others of the fins 24 extend unbroken entirely (substantially entirely) through the first wider rectangular area 41. Yet others of the fins 24 extend unbroken entirely (substantially entirely) through the second wider rectangular area 42.

Throughout the first coverage area (comprising 40 and 41), and also throughout the second coverage area (comprising 40 and 42), in this example, the following characteristics hold: Laterally-extending widths of the contacts 21, 22 are uniform, and might be in the range 6-30 nm. Laterally-extending widths of the gates 23 are uniform, and might be in the range 10-30 nm. Longitudinally-extending widths of the fins 24 are uniform, and might be in the range 4-15 nm. Laterally-extending spacing between gates 24 and the gates' neighboring contacts 21, 22 is uniform, and might be in the range 6-30 nm. Longitudinally-extending spacing between neighboring fins is uniform, and might be in the range 10-40 nm. The fin-to-fin pitch is uniform, and might be in the range 10-40 nm. The above ranges for the respective parameters (i.e., parameters relating to widths, and spacing and pitch) are examples ranges. A possible advantage of decreasing the values for each of these parameters is the attainment of smaller circuit size. Another possible advantage of decreasing the values for each of these parameters is the attainment of increased number of gates, contacts and fins and increased contact surface area between gates and fins and between contacts and fins, which in turn results in lower on-resistance. On the other hand, a possible advantage of increasing the values for each of these parameters is the attainment of improved accuracy with which each component can be positioned relative to the overall size of the component. Accordingly, each of the above parameter ranges may be optimal in balancing the advantage for small size and lower on-resistance with the advantage for relative positioning accuracy.

Each of the projections 41LP, 41RP, 42RP can overlie or underlie a circuit that communicates with the switch structure 10, or extend outward to engage or be adjacent to a circuit that communicates with the switch structure 10. For example, the first wider rectangular area's left projection 41LP extends leftward to the control circuit 11 (FIGS. 1-2) that controls the switch structure 10. The first wider rectangular area's right projection 41RP may overlie or underlie the logic circuit 12 that the switch structure controls (selectively conducts) power to. The second wider rectangular area's right projection 42RP may overlie or underlie or be adjacent to another circuit, another logic cell, another header cell and/or a TAP cell region.

The switch structure 10 includes noncovered areas 50 (FIG. 8), i.e., areas where the switch coverage area does not extend outward. These noncovered areas 50 are free of the switch structure 10 components to make room for other components 51 (e.g., logic components) of the circuit.

The contacts 21, 22 might be made of, for example, one or more materials selected from Al, Co, Cu, W, or other suitable materials.

The gates 23 might be made of, for example, one or more materials selected from TiN, W, Cu, Co, or other suitable materials.

The fins 24 might be made of, for example, one or more materials selected from Si, SiGe, SiGeAs, or other suitable materials.

If the switch structure 10 is in a header region (as in FIG. 1), the switch structure 10 is PMOS. If the switch structure 10 is in a footer region (as in FIG. 2), the switch structure 10 is NMOS.

Figure 8:
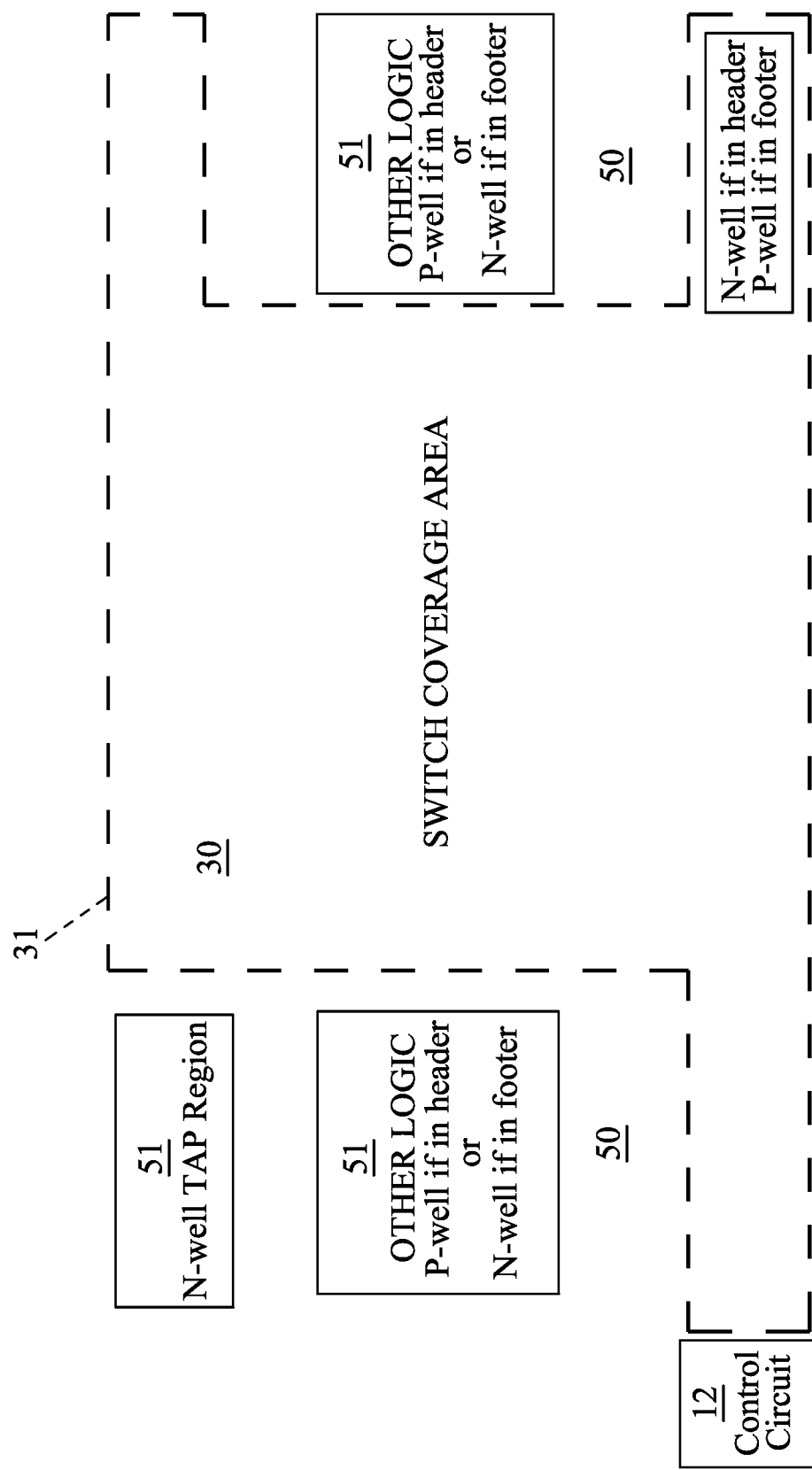
FIG. 8 shows an example position of the switch structure relative to positions of adjacent circuits that communicate with the switch structure, in accordance with some embodiments.

FIG. 8 shows an example of locations of circuits that are external to the switch structure 10, relative to the switch structure 10, within a semiconductor device. The control circuit 12 may control turning on and off the switch structure 10 for the header and footer (FIGS. 1 and 2). The TAP region (cell) may define a well voltage (N-well in VDD and P-well in GND).

Figure 9:
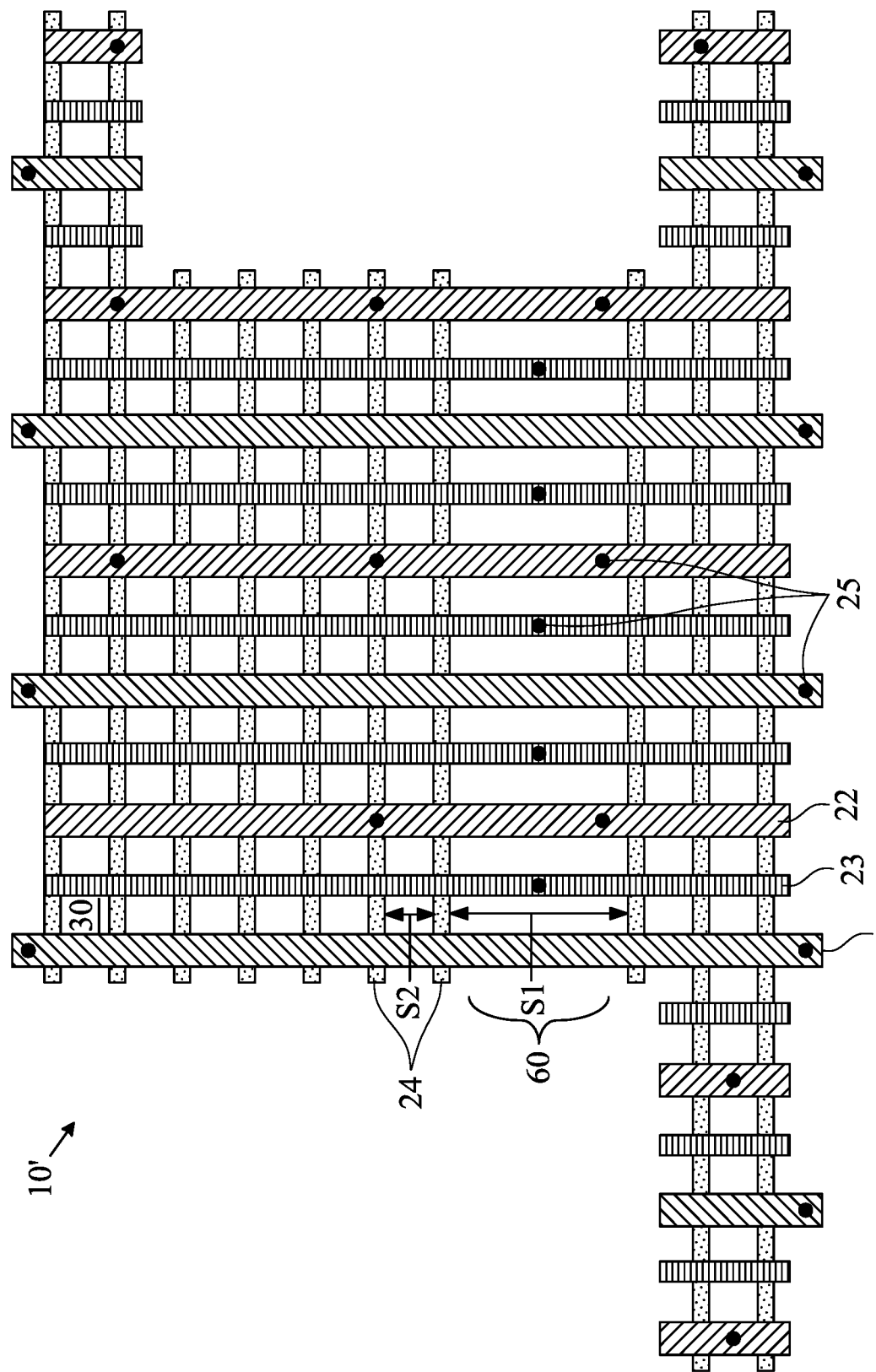
FIG. 9 is a top view, similar to FIG. 4, of an alternative switch structure, in accordance with some embodiments.

FIG. 9 shows an alternative switch structure 10' that is similar to, and has the same shape and size as, the switch structure 10 of FIGS. 3-4. The alternative switch structure 10' differs from the example switch structure 10 of FIGS. 3-4 in that it has a fin-free area 60 that lacks a fin (in which a fin is missing). The fin-free area 60 of the switch structure 10' has a larger fin-to-fin spacing (S1) than the fin-to-fin spacing (S2) in the other areas of the switch structure 10 (above and below the fin-free area 60). In contrast, the fin-to-fin spacing in the switch structure 10 of FIGS. 3-4 is uniform throughout the switch structure because the switch structure 10 has no fin-free area. In FIG. 9, all of the gate vias (vias 25 that extend through gates 23) are located in the fin-free area 60. In contrast, in the example of FIG. 3-4, some gate vias 25 are located directly above a fin 24, and others are located between two neighboring fins 24 in a non-fin-free area. The switch structure 10 of FIGS. 3-4 has a series of fins that is continuous, in that the series is not interrupted by a fin-free space. Relative to the switch structure 10' of FIG. 9, the switch structure 10 appears as though the fins above and below the fin-free area 60 of FIG. 9 are merged together to eliminate the fin-free area 60. The absence of a fin-free area in the switch structure 10 of FIGS. 3-4 provides a greater number of fins, in the same coverage area, than the switch structure 10' in FIG. 9.

This example finFET switch structure of FIGS. 3-4 is well suited for use in applications of low voltage, such as where the supply voltage VDD is 1.1V or less, for example in the range 0.3V-1.1V. One reason is that this example switch structure 10 does not include a fin-free area as does the switch structure 10'. A prior art switch structure has a fin-free area for the following reason. A misaligned gate via, which is not sufficiently centered on the gate, might touch (contact) an adjacent source/drain contact. In the prior art, to avoid a gate via touching a source/drain contact, in the vicinity of a gate via, the top surface of a prior art source/drain contact is positioned at a lower level than the top surface of the adjacent gate. Lowering of the contact's top surface relative to the gate's top surface, in the vicinity of a gate via, avoids the contact being touched by a misaligned gate via. To facilitate lowering the contact's top surface in the prior art, one or more fins are removed in the vicinity of the gate via.

In contrast to the prior art, in the vicinity of gate vias in the example FinFET of FIGS. 3-4, neighboring contacts 21, 22 do overlie a fin 24.

As explained above, the switch structure 10 of FIGS. 3-4 lacks a fin-free area, but is instead fully covered by fins. Therefore, the number of fins per area is greater in the switch structure 10 of FIGS. 3-4 that lacks a fin free area, than in the switch structure 10' of FIG. 9 that includes a fin-free area. The greater number of fins in the switch structure 10 of FIGS. 3-4 (relative to the switch structure 10' of FIG. 9) yields greater fin contact area (i.e., surface area by which the fins 24 contact the contacts 21, 22 and gates 23) per unit area of the switch's coverage area 30. The greater fin contact area in turn yields lower on-resistance, because on-resistance is inversely related to fin contact area. The lower on-resistance, in turn, allows the switch structure 10 of FIGS. 3-4 to function with a lower supply voltage. That is because lowering the on-resistance increases current flow and thus counteracts the reduction in current flow that would otherwise occur with lower supply voltage.

Another reason the finFET switch structure of FIG. 3-4 is well suited for use in applications of low voltage is that the switch's coverage area (surrounded by periphery 31) is not limited to a single rectangular shape, and instead follows a projection-based pattern that projects outward (projections 41LP, 41RP, 42RP) beyond the narrow rectangle 40. The projections 41LP, 41RP, 42RP extend into small vacant spaces of the semiconductor device that the switch would not be able to extend into if the switch coverage area were limited to a single rectangular shape. The projections might add, for example, 40% or 50% more coverage area than what would be provided by a single rectangular shape that could not extend into small vacant areas. The projections might add additional fin areas outside a header/footer area. The greater coverage area in the projection-based switch structure 10 of FIGS. 3-4 yields lower on-resistance than if the switch structure did not include projections. The lower on-resistance, in turn, allows the projection-based switch structure 10 to function with a lower supply voltage than if the switch structure did not have projections.

The projection-based pattern of the switch structure 10 of FIGS. 3-4 also enables overlap of the external circuits that communicate with the switch structure, instead of communicating with the external circuit through metal lines over a horizontal distance. The non-rectangular shape may be enabled by allowing the fins 24 of the switch structure 10 to extend beyond the switch coverage area 30 and into the coverage areas of other logic (e.g., another finFET or a non-finFET transistor).

Figure 10:
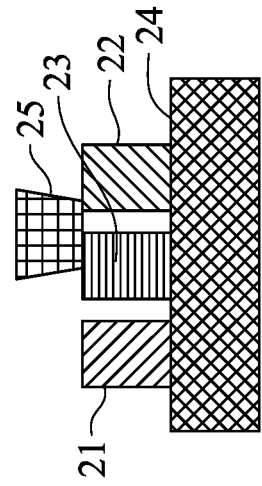
FIG. 10 is a side view taken at line 10-10 of FIG. 6, showing a configuration in which a gate via of the switch structure is centered on a gate of the switch structure.
Figure 11:
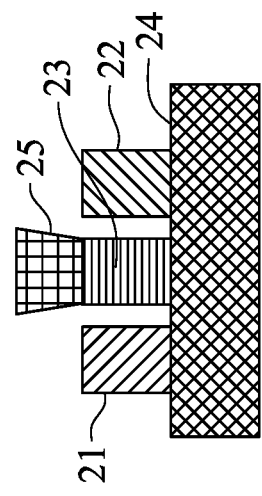
FIG. 11 is side view similar to FIG. 10, showing a configuration in which the gate via is off-center relative to the gate and contacts a source of the switch structure.

FIG. 10 is a side view of a portion of the switch structure 10, taken at line 10-10 of FIG. 6. FIG. 10 shows the source contact 21, the drain contact 22 and the gate 23 overlying the fin 24, and the gate via 25 overlying the gate 23. The gate via 25 is properly centered on the gate 23 and spaced away from the source and drain contacts 21, 22. FIG. 11 is side view similar to FIG. 10, but showing a configuration in which the gate via 25 is not properly centered on the gate 23. The gate via 25 is instead off-center relative to (misaligned with) the gate 23 and contacts the source 22.

Figure 12:
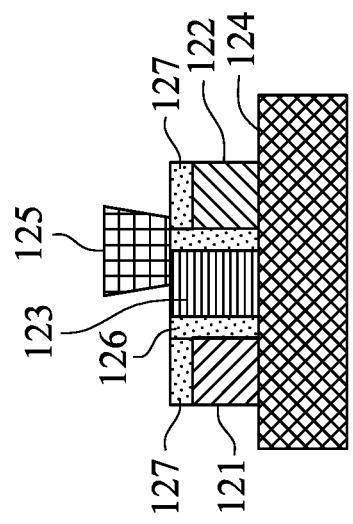
FIG. 12 is a side view similar to FIG. 10, but in accordance with a different embodiment in which a barrier material is located above and alongside the source.
Figure 13:
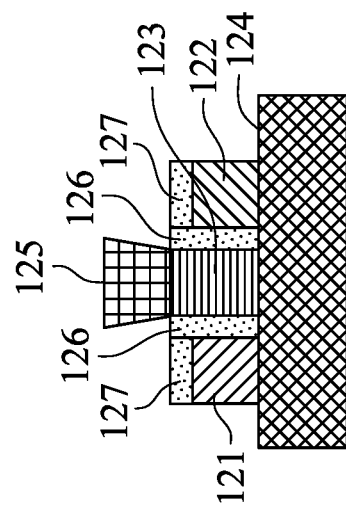
FIG. 13 is a side view similar to FIG. 12, showing a configuration in which the gate via is off-center relative to the gate and is shielded from the source by the barrier material.

FIGS. 12-13 are a side views similar to FIGS. 10-11, but in accordance with a different embodiment that helps avoid the gate via contacting the source and drain. Similar to the embodiment of FIG. 10, the embodiment of FIG. 12 has a source contact 121, a drain contact 122 and a gate 123 that overlie a fin 124, and a gate via 125 that overlies the gate 123. However, the embodiment of FIG. 10 differs from the embodiment of FIG. 12 as follows. Side insulating barriers 126 of barrier material are disposed between the gate 123 and the contacts 121, 122. Top surfaces of the contacts 121, 122 are lower than a top surface of the gate 123. A top insulating barrier 127 of barrier material (e.g., the same barrier material as the barriers 126) overlies each contact 121, 122. The top insulating barrier 127 has a top surface that is at the same level (e.g., is coplanar with) the tops of the contacts 121, 122. As shown in FIG. 13, if the gate via 125 is misaligned toward one of the contacts 122, the gate via 125 is blocked by the top barrier material contact 127 from contacting the contact 122. Also, the side insulating barriers 126 prevent the gate via 125 from contacting the sides of the contacts 21, 22

In an embodiment, a semiconductor switch structure includes source contacts, drain contacts, gates and fins. The contacts and gates are elongated in a longitudinal direction and are spaced apart from each other in a lateral direction perpendicular to the longitudinal direction. The gates are interspersed between the contacts. The fins underlie both the contacts and the gates. The fins are elongated in the lateral direction and are spaced apart from each other in the longitudinal direction. A contact via extends through one of the contacts without contacting a gate or a fin. A gate via extends through one of the gates without contacting a contact or a fin. A contact-gate via is in contact with both a contact and a gate but not a fin.

In another embodiment, a semiconductor switch structure includes source contacts and drain contacts and gates. The contacts and the gates are elongated in a longitudinal direction and are spaced apart from each other in a lateral direction perpendicular to the longitudinal direction. The gates are interspersed between the contacts. The fins underlie both the contacts and the gates. The fins are elongated in the lateral direction and are spaced apart from each other in the longitudinal direction. A coverage area, through which the switch structure extends, is defined by a narrower rectangular area and a wider rectangular area that are adjoined together. Each of the narrower rectangular area and the wider rectangular area is defined by a longitudinally-extending left periphery and a longitudinally-extending right periphery that together define a laterally-extending width of the respective rectangular area, in which the width of the wider rectangular area is greater than the width of the narrower rectangular area. Each of the narrower rectangular area and the wider rectangular area is further defined by a laterally-extending top periphery and a laterally-extending bottom periphery that together define a longitudinally-extending length of the narrower rectangular area. The narrower rectangular area and the wider rectangular area are adjoined together by one of the laterally-extending peripheries of the narrower rectangular area coinciding with one of the laterally-extending peripheries of the wider rectangular area. At least one of the contacts extends unbroken entirely through both the narrower rectangular area and the wider rectangular area.

In yet another embodiment, a semiconductor switch structure includes source contacts and drain contacts and gates. The contacts and the gates are elongated in a longitudinal direction and are spaced apart from each other in a lateral direction perpendicular to the longitudinal direction. The gates are interspersed between the contacts. Fins underlie both the contacts and the gates. The fins are elongated in the lateral direction and are spaced apart from each other in the longitudinal direction. Each fin includes a top surface and two opposite side surfaces. Each contact is in direct contact with at least one of the fins along an entire width of the fin's top surface and an entire height of the fin's two opposite side surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor switch structure comprising:
   contacts, including source contacts and drain contacts;
   gates, wherein the contacts and the gates are elongated in a first direction and are spaced apart from each other in a second direction perpendicular to the first direction, and wherein the gates are interspersed between the contacts;
   fins that underlie both the contacts and the gates and that are elongated in the second direction and are spaced apart from each other in the first direction, wherein the contacts and gates are in direct contact with the fins that are beneath them;
   a contact via that extends through one of the contacts without contacting a gate or a fin;
   a gate via that extends through one of the gates without contacting a contact or a fin; and
   a contact-gate via that is in contact with both a contact and a gate but not a fin.

2. The semiconductor switch structure of claim 1, further comprising:
   a coverage area, through which the switch structure extends, defined by a narrower rectangular area and a wider rectangular area that are adjoined together, wherein each of the narrower rectangular area and the wider rectangular area is defined by:
   a first side periphery and an opposite second side periphery that extend in the first direction and together define a width of the respective rectangular area, in which the width of the wider rectangular area is greater than the width of the narrower rectangular area, and
   a top periphery and a bottom periphery that extend in the second direction and together define a length of the respective rectangular area;
   wherein the top periphery of the narrower rectangular area coincides with the bottom periphery of the wider rectangular area, and wherein at least one of the contacts extends unbroken through both the narrower rectangular area and the wider rectangular area.

3. The semiconductor switch structure of claim 2, wherein at least some of the contacts extend unbroken through both the narrower rectangular area and the wider rectangular area.

4. The semiconductor switch structure of claim 2, wherein at least some of the gates extend unbroken through both the narrower rectangular area and the wider rectangular area.

5. The semiconductor switch structure of claim 2, wherein all of the gates that are in the narrower rectangular area and all of the contacts that are in the narrower rectangular area extend unbroken through both the narrower rectangular area and the wider rectangular area.

6. The semiconductor switch structure of claim 2, wherein some of the fins extend unbroken through the narrower rectangular area, and others of the fins extend unbroken through the wider rectangular area.

7. The semiconductor switch structure of claim 2, wherein the wider rectangular area extends, in the second direction, beyond the first side periphery of the narrower rectangular area.

8. The semiconductor switch structure of claim 7, wherein the wider rectangular area extends, in the second direction beyond the second side periphery of the narrower rectangular area.

9. The semiconductor switch structure of claim 2, wherein a projection of the wider rectangular area, which projects in the second direction beyond the narrower rectangular area, overlies or underlies a control circuit that controls the switch structure.

10. The semiconductor switch structure of claim 2, wherein a projection of the wider rectangular area, which projects in the second direction beyond the narrower rectangular area, overlies or underlies a logic circuit that the switch structure controls power to.

11. The semiconductor switch structure of claim 1, wherein throughout the coverage area:
    widths, extending in the second direction, of the contacts are uniform;
    widths, extending in the second direction, of the gates are uniform;
    widths, extending in the first direction, of the fins are uniform;
    spacing between each gate and the gate's neighboring contact is uniform; and
    spacing between neighboring fins is uniform.

12. The semiconductor switch structure of claim 1, wherein at least one of the fins is in direct contact with at least one of the contacts and at least one of the gates.

13. The semiconductor switch structure of claim 1, further comprising:
    at least one insulating barrier that has a lower surface that overlies one of the contacts and an upper surface that is coplanar with top surfaces of the gates.

14. A semiconductor switch structure comprising:
    contacts, including source contacts and drain contacts;
    gates, wherein the contacts and the gates are elongated in a first direction and are spaced apart from each other in a second direction perpendicular to the first direction, and wherein the gates are interspersed between the contacts;
    fins that underlie both the contacts and the gates and that are elongated in the first direction and are spaced apart from each other in the second direction, wherein the contacts and gates are in direct contact with the fins that are beneath them;
    a coverage area, through which the switch structure extends, defined by a narrower rectangular area and a wider rectangular area that are adjoined together, wherein each of the narrower rectangular area and the wider rectangular area is defined by:
        a first side periphery and an opposite second side periphery that extend in the first direction and together define a width of the respective rectangular area, in which the width of the wider rectangular area is greater than the width of the narrower rectangular area, and
        a top periphery and a bottom periphery that extend in the second direction and together define a length of the narrower rectangular area;
    wherein the narrower rectangular area and the wider rectangular area are adjoined together by one of the top and bottom peripheries of the narrower rectangular area coinciding with one of the top and bottom peripheries of the wider rectangular area, and wherein at least one of the contacts extends unbroken entirely through both the narrower rectangular area and the wider rectangular area.

15. The semiconductor switch structure of claim 14, wherein all of the contacts extend unbroken entirely through both the narrower rectangular area and the wider rectangular area.

16. The semiconductor switch structure of claim 14, wherein at least some of the gates extend unbroken entirely through both the narrower rectangular area and the wider rectangular area.

17. The semiconductor switch structure of claim 14, wherein all of the gates extend unbroken entirely through both the narrower rectangular area and the wider rectangular area.

18. The semiconductor switch structure of claim 14, wherein at least some of the fins extend unbroken entirely through the narrower rectangular area, and others of the fins extend unbroken entirely through the narrower rectangular area.

19. A semiconductor switch structure comprising:
    contacts, including source contacts and drain contacts;
    gates, wherein the contacts and the gates are elongated in a first direction and are spaced apart from each other in a second direction perpendicular to the first direction, and wherein the gates are interspersed between the contacts; and
    fins that underlie both the contacts and the gates and that are elongated in the second direction and are spaced apart from each other in the first direction, wherein the contacts and gates are in direct contact with the fins that are beneath them, and wherein each fin includes a top surface and two opposite side surfaces;
    wherein each gate is in direct contact with at least one of the fins along the entire width of the fin's top surface and the entire height of each of the fin's two opposite side surfaces.

* * * * *